(12) United States Patent
Lenssen

(10) Patent No.: US 7,474,547 B2
(45) Date of Patent: Jan. 6, 2009

(54) ACTIVE SHIELDING FOR A CIRCUIT COMPRISING MAGNETICALLY SENSITIVE MATERIALS

(75) Inventor: Kars-Michiel Hubert Lenssen, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/570,174

(22) PCT Filed: Aug. 20, 2004

(86) PCT No.: PCT/IB2004/051509

§ 371 (c)(1),
(2), (4) Date: Feb. 28, 2006

(87) PCT Pub. No.: WO2005/022546

PCT Pub. Date: Mar. 10, 2005

(65) Prior Publication Data

US 2006/0262585 A1     Nov. 23, 2006

Related U.S. Application Data

(60) Provisional application No. 60/499,556, filed on Sep. 2, 2003.

(51) Int. Cl.
*G11C 7/02* (2006.01)

(52) U.S. Cl. .............................. 365/53; 365/55; 365/98; 365/173; 365/158

(58) Field of Classification Search .................. 365/53, 365/55, 98, 131, 173, 157, 158
See application file for complete search history.

(56) References Cited

U.S. PATENT DOCUMENTS

| | | | | |
|---|---|---|---|---|
| 5,671,105 A * | 9/1997 | Sugawara et al. | ............ | 360/321 |
| 5,986,355 A * | 11/1999 | Rosen | ............ | 307/101 |
| 6,636,399 B2 * | 10/2003 | Iwasaki et al. | ....... | 257/E21.665 |
| 6,717,403 B2 * | 4/2004 | Witcraft et al. | ............. | 324/252 |
| 6,724,674 B2 * | 4/2004 | Abraham et al. | ............ | 365/211 |
| 2002/0008988 A1 | 1/2002 | Lenssen et al. | | |
| 2002/0085411 A1 | 7/2002 | Freitag et al. | | |
| 2002/0097533 A1 * | 7/2002 | Funayama et al. | ....... | 360/324.1 |
| 2006/0012459 A1 * | 1/2006 | Lenssen | ................... | 338/32 R |

* cited by examiner

*Primary Examiner*—Thong Q Le
(74) *Attorney, Agent, or Firm*—Peter Zawilski

(57) ABSTRACT

Magnetic shielding is provided using a variety of methods, systems, devices and circuits. Aspects of present invention provide a method for providing magnetic shielding for a circuit comprising magnetically sensitive materials. The circuit is actively shielded from a disturbing magnetic field. A corresponding semiconductor device is also provided. The method and device can provide shielding for strong disturbing magnetic fields.

12 Claims, 1 Drawing Sheet

ACTIVE SHIELDING FOR A CIRCUIT COMPRISING MAGNETICALLY SENSITIVE MATERIALS

CROSS REFERENCE TO RELATED APPLICATION

This application claims the benefit of U.S. provisional application Ser. No. 60/499,556 filed Sep. 2, 2003, which is incorporated herein whole by reference.

The present invention relates to methods of shielding of circuits comprising magnetically sensitive materials from external magnetic fields. More particularly the present invention relates to a method and device having for actively shielding circuits comprising magnetically sensitive materials from high external magnetic fields.

Circuits comprising magnetically sensitive materials may be semiconductor devices having magnetic materials used therein. Magnetic materials are used, for example, in magnetic cell memories and magnetic field sensors.

Magnetic or Magnetoresistive Random Access Memory (MRAM) is currently being considered by many companies as a successor to flash memory. It has the potential to replace all but the fastest static RAM (SRAM) memories. This makes MRAM very suitable as embedded memory for System on Chip (SoC). It is a non-volatile memory (NVM) device, which means that no power is required to sustain the stored information. This is seen as an advantage over most other types of memory.

The MRAM concept was originally developed at Honeywell Corp. USA, and uses magnetisation direction in a magnetic multi-layer device as information storage and the resultant resistance difference for information readout. As with all memory devices, each cell in an MRAM array must be able to store at least two binary states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR or Magnetic Tunnel Junction (MTJ) or Spin Dependent Tunneling (SDT) effect provide possibilities to realise a.o. non-volatile magnetic memories. These devices comprise a stack of thin films of which at least two are ferromagnetic or ferrimagnetic, and which are separated by a non-magnetic interlayer. GMR is the magneto-resistance for structures with conductor inter-layers and TMR is the magneto-resistance for structures with dielectric inter-layers. If a very thin conductor is placed between two ferromagnetic or ferrimagnetic films, then the effective in-plane resistance of the composite multi-layer structure is smallest when the magnetisation directions of the films are parallel and largest when the magnetisation directions of the films are anti-parallel. If a thin dielectric interlayer is placed between two ferromagnetic or ferrimagnetic films, tunneling current between the films is observed to be the largest (or thus resistance to be the smallest) when the magnetisation directions of the films are parallel and tunneling current between the films is the smallest (or thus resistance the largest) when the magnetisation directions of the films are anti-parallel.

Magneto-resistance is usually measured as the percentage increase in resistance of the above structures going from parallel to anti-parallel magnetisation states. TMR devices provide higher percentage magneto-resistance than GMR structures, and thus have the potential for higher signals and higher speed. Recent results indicate tunneling giving over 40% magneto-resistance, compared to 10-14% magneto-resistance in good GMR cells.

A typical MRAM device comprises a plurality of magnetoresistive memory elements, e.g. magnetic tunneling junction (MTJ) elements, arranged in an array. MTJ memory elements generally include a layered structure comprising a fixed or pinned layer, a free layer and a dielectric barrier in between. The pinned layer of magnetic material has a magnetic vector that always points in the same direction. The magnetic vector of the free layer is free, but constrained within the easy axis of the layer, which is determined chiefly by the physical dimensions of the element. The magnetic vector of the free layer points in either of two directions: parallel or anti-parallel with the magnetisation direction of the pinned layer, which coincides with the said easy axis. The fundamental principle of MRAM is the storage of information as binary data, e.g. as "0" and "1", based on directions of magnetisation. This is why the magnetic data is non-volatile and will not change until it is affected by an external magnetic field.

Storing data is accomplished by applying magnetic fields and thereby causing magnetic material in the free layer to be magnetised into either of two possible memory states. When both magnetic films of the layered structure of an MRAM-cell are magnetised with the same orientation (parallel), the data is either of two binary values, e.g. "0", otherwise, if both magnetic films of the layered structure of the MRAM-cell are magnetised with inverse orientation (anti-parallel), the data is the other binary value, e.g. "1". The magnetic fields are created by passing currents through strip lines (word lines and bit lines) external to the magnetic structures. However, alternative methods of writing MRAMs exist, like for example by using spin-polarized currents through the magnetic layer.

Reading data is accomplished by sensing resistance changes in a cell. Making use of the fact that the resistance of the layered structure varies depending on whether or not the orientations are parallel, the system can discriminate both binary values of the data, e.g. "0" or "1".

It is a disadvantage of most electronic components and MRAM cells, and magnetic memory cells in general are no exception, that an intentional or unintentional exposure to strong magnetic fields makes them vulnerable. Very high density MRAMs are particularly sensitive to stray magnetic fields mainly because the minuscule MRAM cells require relatively low magnetic fields for read/write operations which depend upon the switching or sensing of magnetic vectors. These magnetic vectors are, in turn, easily affected and may have their magnetic orientation changed by such external stray magnetic fields.

Therefore, usually some type of magnetic shielding is desired. Several solutions have been proposed, using thin soft-magnetic layers or using packaging containing magnetic particles as a shielding means.

Solutions that have been proposed so far to provide a layer-type shielding for MRAM include expensive deposition and/or patterning techniques. Expensive deposition, such as e.g. sputter deposition, limits the thickness of the shielding layer that is still affordable in practice, and thus limits the obtainable shield effect. Patterning techniques comprising several mask steps, e.g. to pattern the shield, or to open up contact pads for connection of the MRAM to the outside world, endanger the competitiveness of MRAM compared to alternative conventional memory technologies that do not require magnetic shielding.

Proposals to embed soft-magnetic particles in the moulding plastic may provide an alternative in the future, but their practical feasibility is still uncertain, would require a change of the existing standard packaging processes and could cause reliability and quality issues. Moreover, if the embedded particles are conductive, they could affect the high frequency RF properties of logic on the IC.

A significant problem, however, which is common to all existing solutions is the limited shielding effect provided by the shielding means. For smartcards it is presently required that the electronics present on the card can survive exposure to fields of 1000 Oe up to 8000 Oe. This would require a field attenuation of 200 to 1600 times the field attenuation which can be obtained by presently used shielding methods.

In US-2002/0008988 a solution is proposed to protect magnetic memories against strong magnetic disturbing fields. In the magnetic memory described, this is performed by splitting a shielding layer into mutually separated regions covering the memory elements. The magnetic memory is not erased by high external magnetic fields because of a strong attenuation of the external magnetic field by the regions of the shielding layer. As the shielding layer in the memory as described is split into mutually separated regions, the magnetic field can fan out between the regions. In the magnetic regions of the shielding layer, the magnetic field lines are drawn into the material. The density of the magnetic field lines in these regions is thus reduced with respect to a continuous layer, as a result of which saturation of the magnetisation occurs less rapidly, so that a stronger magnetic field can be shielded than in the case of a continuous shielding layer of the same layer thickness.

Although the solution described performs better than other passive shielding devices because saturation of the magnetisation of the magnetic layer occurs less rapidly, still special measures and design rules are needed to obtain shielding up to very high fields, because of the required separation distance between the shield parts. At those high external magnetic fields, the separate regions of the shielding layer are saturated and the magnetic field penetrates through the shielding layer, as a result of which the stored magnetisation direction in the memory elements can flip over and the non-volatile memory may be erased. Weak magnetic fields of a few kA/m are already sufficient to erase magnetic memory elements.

It is therefore an object of the present invention to provide a new way of shielding circuits comprising magnetically sensitive materials, in order to meet the requirement of being able to shield for external magnetic fields, e.g. of 80 kA/m and enable the application of MRAM in smartcards and other applications where strong magnetic fields can be encountered.

The above objective is accomplished by a method and device according to the present invention.

In a first aspect, the present invention provides a method for providing magnetic shielding for a circuit comprising magnetically sensitive materials, wherein the method comprises actively shielding the circuit from a disturbing magnetic field. The circuit may be any circuit comprising magnetically sensitive materials, such as for example, but not limited to, MRAM memories comprising MRAM elements.

It is an advantage of the present invention that, during manufacturing of a device, several mask steps can be saved if active shielding is used instead of passive shields. Furthermore, very little extra chip area is needed. No new materials nor processing steps are required.

The method according to the present invention may comprise measuring a disturbing magnetic field, and at least partially compensating for the measured disturbing magnetic field. Compensating for the measured disturbing magnetic field may comprise generating a magnetic compensation field. However, also other feedback signals can be envisioned, like e.g. a spin-polarized current through the device or modulating a shield in combination with a permanent magnet that provides a compensation field. It is advantageous if no additional magnetic materials are needed for the compensation.

The method according to the present invention may furthermore comprise determining whether compensating for the measured disturbing magnetic field is necessary. This may comprise comparing a measured disturbing magnetic field value with a pre-set threshold value. This has the advantage that compensation fields are only applied when the local disturbing magnetic field is larger than the pre-set threshold value, e.g. 4 Oe. This limits the corresponding power consumption when no or only a very small disturbing magnetic field is present.

The method according to the present invention may furthermore comprise, on top of the active shielding, passively shielding the circuit from the disturbing magnetic field. The combined shielding methods lead to increased shielding results, so that shielding against very high external magnetic fields, in the order of thousands of Oe's, can be obtained.

In a second aspect, the present invention provides a semiconductor device, such as an IC, provided with a circuit comprising magnetically sensitive materials, wherein the semiconductor device furthermore comprises means for actively shielding the circuit from a disturbing magnetic field. The means for actively shielding the circuit may comprise a measuring means for measuring the disturbing magnetic field, and a compensation means for compensating for the disturbing magnetic field. The measuring means may be integrated in the circuit. Only very little extra chip area is needed, only for the feedback logic circuit and possibly a few extra sensor elements per IC. No new materials, nor processing steps, nor extra mask steps are required. The measuring means may for example be a Hall sensor.

The compensation means may comprise a magnetic field source for generating a magnetic compensation field for compensating for the disturbing magnetic field. The magnetic field source may for example be a planar coil or a current carrying conductor. The magnetic field source may be integrated in the circuit. No unconventional technologies are needed.

The compensation means may comprise a decision circuit for determining whether active feedback is needed. The decision circuit may comprise a comparator for comparing the measured disturbing magnetic field with a pre-set threshold value.

In the semiconductor device according to the present invention, the circuit comprising magnetically sensitive materials may be an MRAM device comprising MRAM elements, an the measuring means may be an MRAM element. The MRAM element used for the measuring means may have a same stack composition as the MRAM elements in the circuit. Preferably, the MRAM element used for the measuring means is more sensitive to magnetic fields than the MRAM elements used in the circuit.

The write lines of the MRAM device may be used for the magnetic field source.

A semiconductor device according to the present invention may furthermore comprise passive magnetic shielding means. The combined active and passive shielding means lead to increased shielding results, so that shielding against very high external magnetic fields can be obtained.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
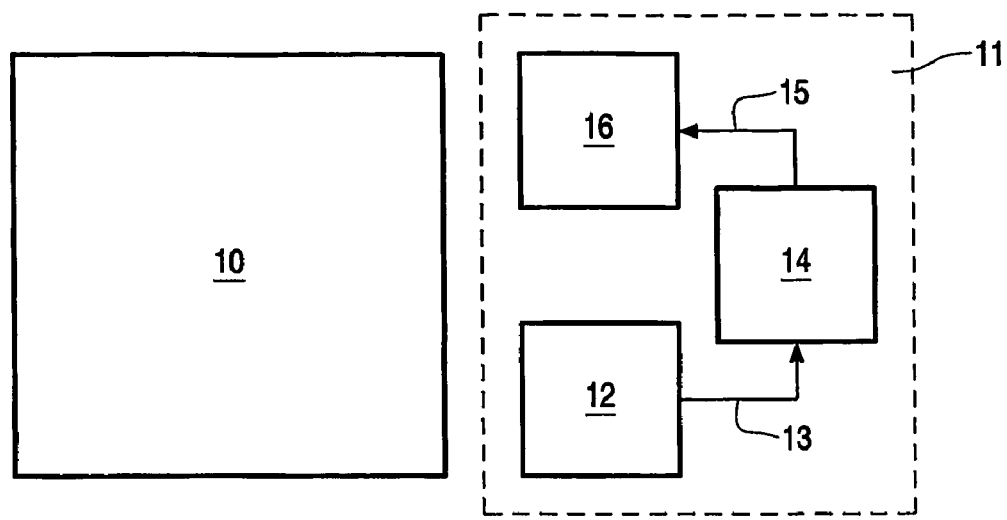
FIG. 1 is a schematic overview of a shielded MRAM device according to an embodiment of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

According to the present invention, a method and a device for actively shielding circuits comprising magnetically sensitive materials, such as for example MRAM elements, are provided. Although the description of the present invention is mainly written in view of MRAM memories comprising MRAM elements, the present invention is not limited thereto, but is more generally directed to active shielding of magnetically sensitive devices.

Figure 2:
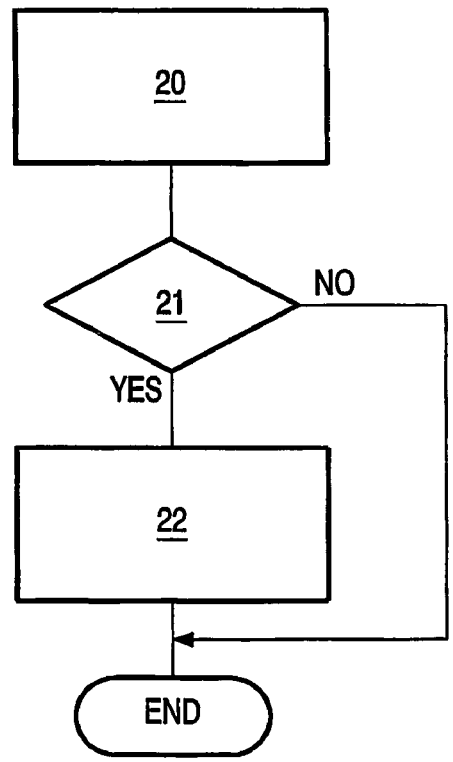
FIG. 2 is a flow chart of a method according to an embodiment of the present invention.

A circuit 10 comprising magnetically sensitive materials, e.g. an MRAM memory, provided with an active shielding means 11 according to an embodiment of the present invention is illustrated schematically in FIG. 1. A flow chart of method according to an embodiment of the present invention for actively shielding a circuit 10 comprising magnetically sensitive materials is shown in FIG. 2.

An active shielding means 11 according to an embodiment of the present invention comprises three parts:
1) a measurement means such as magnetic sensor 12 for measuring 20 a disturbing magnetic field approximately at the location of the MRAM elements, the closer the better, and outputting a magnetic measurement signal 13,
2) a decision circuit 14 which receives the magnetic measurement signal 13 and determines 21 whether the measured disturbing magnetic field needs to be compensated for, the decision circuit 14 generating a compensation control signal 15, and
3) a magnetic field source 16 which receives the compensation control signal 15 and on the basis thereof generates 22 a desired compensating magnetic field. The compensating magnetic field is a magnetic field in a direction opposed with respect to the measured disturbing magnetic field.

The disturbing magnetic fields comprises external stray magnetic fields, i.e. those magnetic fields which are generated from sources external to the circuit 10 and its housing. Stray or externally generated magnetic fields can come from an almost infinite number of sources. There will be a desire in many instances that part of them or all of them have no significant effect on the magnetically sensitive materials of the circuit 10. This is particularly true in case of memory devices where the information contained in the memory is contained in the orientations of the magnetisation vectors of the magnetic material used in each memory cell. Any such external magnetic field effects which would alter the orientations of the magnetisation vectors in the memory cells could contribute to loss of information or to erroneous information being provided by the memory, as any stray magnetic fields having sufficient magnitude may cause the magnetisation vectors stored in a magnetic memory element to change uncontrollably. Recent improvements in magnetic memories may lead to their widespread use in commercial devices. Therefore, such magnetic memories need to be protected from external magnetic field disturbances. Stray fields can also originate from intentional exposure to magnetic fields in order to tamper with the device.

Disturbing magnetic fields may also comprise fields induced by (peak) currents on the chip itself, if the sensing part of the active shielding circuit is also integrated in the chip itself.

The magnetic sensor 12 can be any type of magnetic sensor which may be added to the circuit comprising magnetically sensitive materials, e.g. to an MRAM IC. Preferably, the magnetic sensor 12 is integrated into circuit 10. The magnetic sensor 12 can for example be a Hall sensor, which is a solid state semiconductor sensor which senses magnetic field strength and produces a voltage that changes with this strength.

However, in case of the circuit 10 comprising MRAM elements, it is advantageous to use as magnetic sensor 12 a magnetic tunnel junction with the same stack composition as the MRAM elements in circuit 10. Thus the MRAM elements themselves, or additional MRAM elements which are not used as memory could serve as sensors to monitor the local disturbing field.

Because of the bistable magnetisation configuration of MRAM elements, they are not particularly sensitive to small fields. As soon as they are significantly influenced by a field, there is a risk that also MRAM elements containing data are already affected by the disturbing field. Therefore, it is desirable to use a sensor 12 that is more sensitive than the MRAM elements of the circuit 10 themselves, but nevertheless consists of the same material stack. This can be achieved by e.g. using a different shape of the magnetic element—a lower aspect ratio means that the device is more sensitive, or a larger size using a different orientation—the magnetic orientation of a pinned layer of an MRAM sensor element being substantially parallel to the possible orientation states of the free layer of the MRAM sensor element. In this later embodiment, the MRAM elements are rotated over 90 degrees with respect to the normal MRAM elements in the memory device, while the direction of the magnetisation of the pinned layer, which is usually determined by exchange biasing, is the same. In this so-called crossed-anisotropy geometry the shape anisotropy causes that the direction of the free layer will make an angle of 90 degrees with the direction of the pinned layer, which is the most sensitive point on the working curve of the magnetic tunnel junction. Also the size can be used to tune the sensitivity: a smaller cell size in general increases the sensitivity.

The decision circuit 14 determines whether the disturbing magnetic field measured is large enough to be compensated for. Compensating fields only have to be applied when the local disturbing magnetic field is larger than a threshold value, for example larger than 4 Oe.

If reference cells are used as the sensors 12 in an MRAM device, it can be practical to use reference cells with opposite magnetisation directions of the free layers of the MRAM elements and measure the difference in resistance: in zero-field this difference is zero, in a magnetic field this difference is non-zero. This provides a larger sensor signal than in case that only one element would be used. Moreover, it provides a simple method for the feedback-loop: the decision circuit 14 has to control the magnetic field source 16 such that its input signal 15 (i.e. the resistance difference) becomes zero. In this way also possible temperature effects are eliminated.

For the magnetic field source 16, a planar coil or a current carrying strip can be integrated on the MRAM IC, above or underneath the MRAM array, or alternatively at the backside of the wafer. However, to limit the current that is needed to generate the desired compensation field, the coil or strip should be very close to the MRAM elements. This is difficult to achieve without compromising the density of the MRAM array or without adding extra masks.

Therefore it is desirable to use already existing parts of the MRAM IC, and according to an embodiment of the present invention, the write lines, word lines and/or bit lines, are used for this. Per definition these lines are designed such that the magnetic coupling with the MRAM elements is optimal. By combination of currents through bit lines and word lines, compensation fields in any direction in the plane of the wafer can be generated. In practice this means that background currents are flowing through the write lines, as long as the disturbing field is present, to which the required pulses for writing data into selected memory cells are just added. Of course more subtle ways can be used to calculate and combine the currents needed for operation of the MRAM device (i.e. writing and reading) and those needed for active shielding.

The active shielding according to embodiments of the present invention can be used on its own. This has the advantage that it saves several processing steps in fabrication of a shielded device. If parts inherent in the devices, as explained above for MRAM devices, are used for the active shielding, no extra mask steps are required. No new materials nor processing steps are required.

However, as the active shielding consumes power, it is only useful for MRAM-applications where exposure to magnetic fields rarely occurs, or for which power consumption is not a stringent issue. In order to lower the power consumption, it is desirable to use active shielding in combination with a passive shield (not represented in the drawings) of any kind, for example as described in the prior art. This has the advantage that smaller magnetic fields have to be actively compensated for. Furthermore, this combination allows to approach the magnetic field requirements for smartcard chips.

A passive shield for protection from magnetic fields may be formed of a metal having a relatively high permeability. One such metal which is well known for use in magnetic shielding, and has a high initial permeability, is known as Mu metal and is available from Carpenter Technology Corporation, Carpenter Steel Division. Another material for a shielding layer may be an electrically non-conducting magnetic oxide, for example a ferrite such as $MFe_2O_4$, wherein M=Mn, Fe, Co, Ni, Cu or Mg, among others. Manganites, chromites and cobaltites may be used also, depending on the device characteristics and specific processing requirements. Further, the passive magnetic shielding material may also be composed of magnetic particles, for example nickel or iron particles, which are incorporated into a non-conducting carrier material, for example a glass sealing alloy or a polyimide.

It is desirable to locate the passive shield as close as possible to the magnetisable material so as to minimise the use of shield material, and therefore to minimise the associated weight and cost. In a preferred embodiment the active shielding means 11 is embedded in the device 10 (distributed or as a whole).

The shielded semiconductor device according to embodiments of the present invention has the advantage that very little extra chip area is needed: only for the feedback decision circuit 14, which is a simple circuit, and possibly a few extra MRAM elements per MRAM IC for the magnetic sensors 12. If reference elements are used as sensor, even no extra MRAM elements are needed.

The present invention can be widely applied in all Systems-on-chip (SoC's) comprising magnetically sensitive materials, e.g. in MRAM and in stand-alone MRAM chips, in particular for applications in which significant disturbing magnetic fields can be encountered, like e.g. smartcards, mobile phones, automotive electronics and televisions. The invention can also be used in other spintronic devices that may come up in the future.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A method for providing magnetic shielding for an integrated circuit die having magnetically sensitive materials that use a magneto-resistive effect to store data, the magneto-resistive effect controlled using a local magnetic field, the method comprising:
    sensing a disturbing magnetic field near the magnetically sensitive material; and
    responsive to the sensing, actively shielding the magnetically sensitive materials from the disturbing magnetic field by generating a compensating magnetic field;
    wherein, measuring a disturbing magnetic field includes determining a direction of the disturbing magnetic field, and the compensating magnetic field is in a primarily opposite direction from the disturbing magnetic field; and
    wherein compensating for the measured disturbing magnetic field includes generating a spin-polarized current through the circuit.

2. A semiconductor device comprising:
    a storage circuit comprising magnetically sensitive materials that use a magneto-resistive effect to store data, the magneto-resistive effect controlled using a local magnetic field;
    a sensor for measuring the disturbing magnetic field; and a protective layer for actively shielding the magnetically sensitive materials from a disturbing magnetic field in response to measuring the disturbing magnetic field,
    wherein the protective layer for actively shielding the circuit includes:
    a compensation generator for generating a magnetic field in the protective layer for compensating for the disturbing magnetic field; and
    wherein the compensation generator comprises a magnetic field source for generating a magnetic compensation field for compensating for the disturbing magnetic field.

3. The semiconductor device according to claim 2, wherein the magnetic field source is a planar coil.

4. The semiconductor device according to claim 2, wherein the magnetic field source is a current carrying conductor.

5. The semiconductor device according to claim 2, wherein the magnetic field source is integrated in the storage circuit.

6. The semiconductor device according to claim 2, wherein the compensation generator includes a decision circuit for determining whether active feedback is needed.

7. The semiconductor device according to claim 6, wherein the decision circuit includes a comparator for comparing the measured disturbing magnetic field with a pre-set threshold value.

8. The semiconductor device according claim 2, the storage circuit being an MRAM device including MRAM elements, wherein the sensor is an MRAM element.

9. The semiconductor device according to claim 8, wherein the MRAM element used for the sensor has a same stack composition as the MRAM elements in the storage circuit.

10. The semiconductor device according to claim 8, wherein the MRAM element used for the sensor is more sensitive to magnetic fields than the MRAM elements used in the storage circuit.

11. The semiconductor device according to claim 8, wherein the write lines of the MRAM device are used for the magnetic field source.

12. The semiconductor device according to claim 2, further including passive magnetic shielding.

* * * * *